(12) United States Patent
Bunin et al.

(10) Patent No.: US 10,056,886 B2
(45) Date of Patent: Aug. 21, 2018

(54) CONTINUOUSLY VARIABLE SATURABLE SHUNT REACTOR

(71) Applicant: SIEMENS AKTIENGESELLSCHAFT, Munich (DE)

(72) Inventors: Anatoliy Bunin, Stein (DE); Karsten Loppach, Nuremberg (DE); Johannes Schnieders, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 103 days.

(21) Appl. No.: 15/348,548

(22) Filed: Nov. 10, 2016

(65) Prior Publication Data
US 2017/0134011 A1    May 11, 2017

(30) Foreign Application Priority Data
Nov. 10, 2015   (EP) .................................... 15193880

(51) Int. Cl.
*H03L 5/00*    (2006.01)
*H03K 5/01*    (2006.01)
(Continued)

(52) U.S. Cl.
CPC .............. *H03K 5/01* (2013.01); *G05F 1/38* (2013.01); *H01F 27/24* (2013.01); *H01F 27/28* (2013.01);
(Continued)

(58) Field of Classification Search
CPC ...... H02J 3/18; H02J 3/24; H02J 3/386; H02J 3/1864; H01H 9/563; H02H 9/23
See application file for complete search history.

(56) References Cited

U.S. PATENT DOCUMENTS 6,573,691 B2 *   6/2003   Ma .......................... H02J 3/1864
                                                           323/209

FOREIGN PATENT DOCUMENTS

DE   202013004706 U1   7/2013
DE   102012110969 A1   3/2014
(Continued)

OTHER PUBLICATIONS

Reichert K. et al. "Reactor transformer for controllable static compensators", Cigré Paper 12-05, 1978, International Conference on Large High Voltage Electric Systems, Paris, Aug. 30-Sep. 7, 1978.
(Continued)

*Primary Examiner* — Sibin Chen
(74) *Attorney, Agent, or Firm* — Laurence Greenberg; Werner Stemer; Ralph Locher

(57) ABSTRACT

A continuously variable saturable shunt reactor includes a laminated core having two wound limbs for each phase connected by yokes. A network winding branch is disposed on each limb, high-voltage ends of winding branches of a phase are connected to a phase conductor and low-voltage ends of winding branches are connected to a DC voltage source, to reduce power of the DC voltage sources, degree of distortion of the operating current and control error, and to reduce the number of DC voltage sources. The DC voltage source includes two stabilized, single-pole-grounded power converters with opposite polarities and two electronic transistor changeover switches controlled by a control system, for each phase. The control system feeds direct current to the winding branches of a phase in pulses using the switches and the direct current is fed into the winding branches at opposite poles from different power converters.

9 Claims, 4 Drawing Sheets

(51) Int. Cl.
  *H01F 27/24* (2006.01)
  *H01F 27/28* (2006.01)
  *H03K 5/24* (2006.01)
  *G05F 1/38* (2006.01)
  *H01F 29/14* (2006.01)
  *H02P 13/12* (2006.01)
  *H02J 3/18* (2006.01)

(52) U.S. Cl.
  CPC .............. *H01F 29/14* (2013.01); *H02P 13/12* (2013.01); *H03K 5/24* (2013.01); *H02J 3/1864* (2013.01)

(56) References Cited

FOREIGN PATENT DOCUMENTS

| | | |
|---|---|---|
| RU | 2063084 C1 | 6/1996 |
| RU | 2072604 C1 | 1/1997 |
| RU | 2132581 C1 | 6/1999 |
| RU | 2217829 C2 | 11/2003 |
| RU | 2320061 C1 | 3/2008 |
| SU | 1762322 A1 | 9/1992 |

OTHER PUBLICATIONS

Becker H.: "Die steuerbare Drosselspule. Ein statischer Phasenschieber zur Kompensation von Blindlaststößen [The controllable reactor. A static phase shifter for compensating reactive power shocks]" ETZ-B, 1971, vol. 23, issue 12—Statement of Relevance.

\* cited by examiner

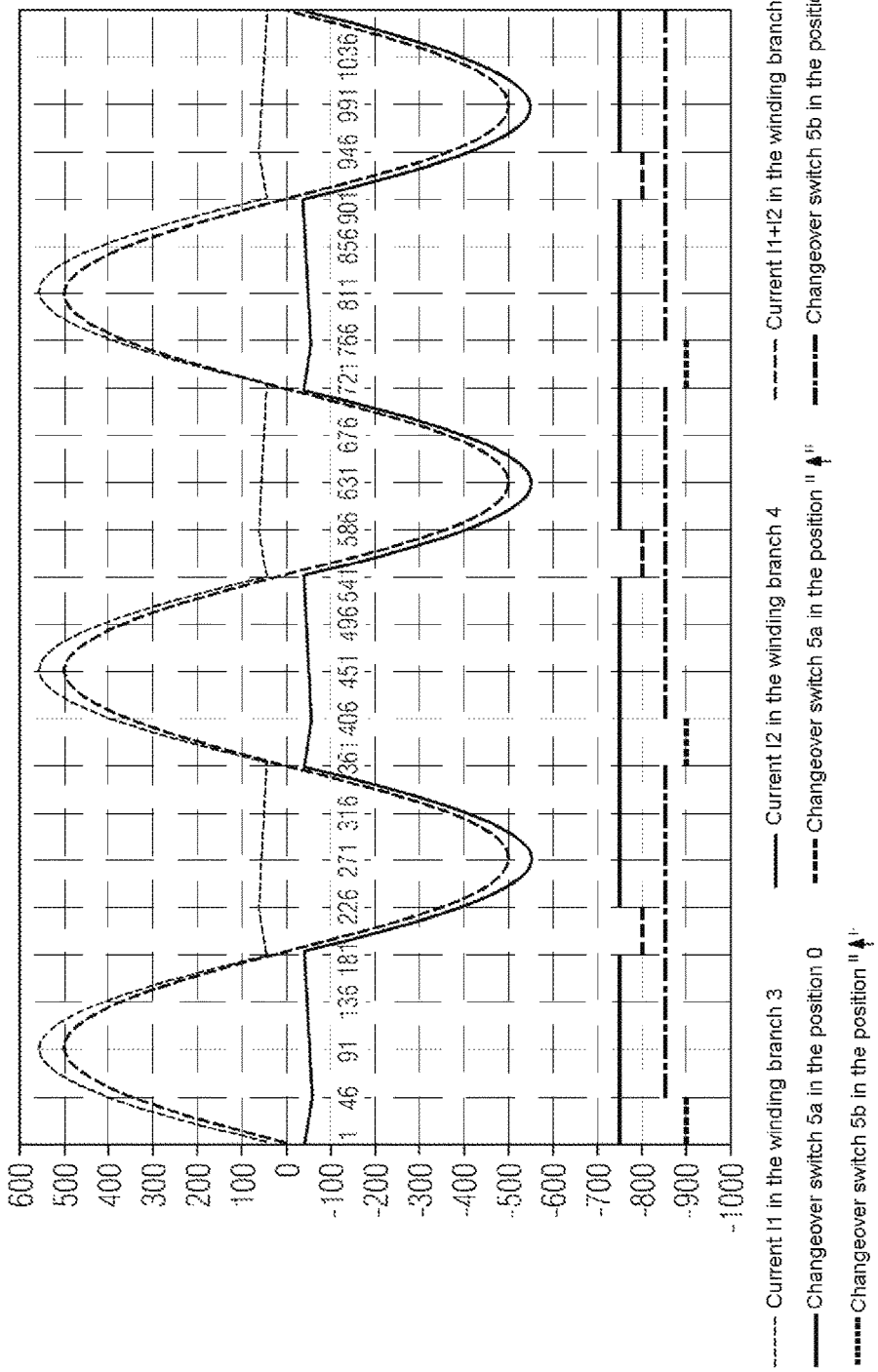

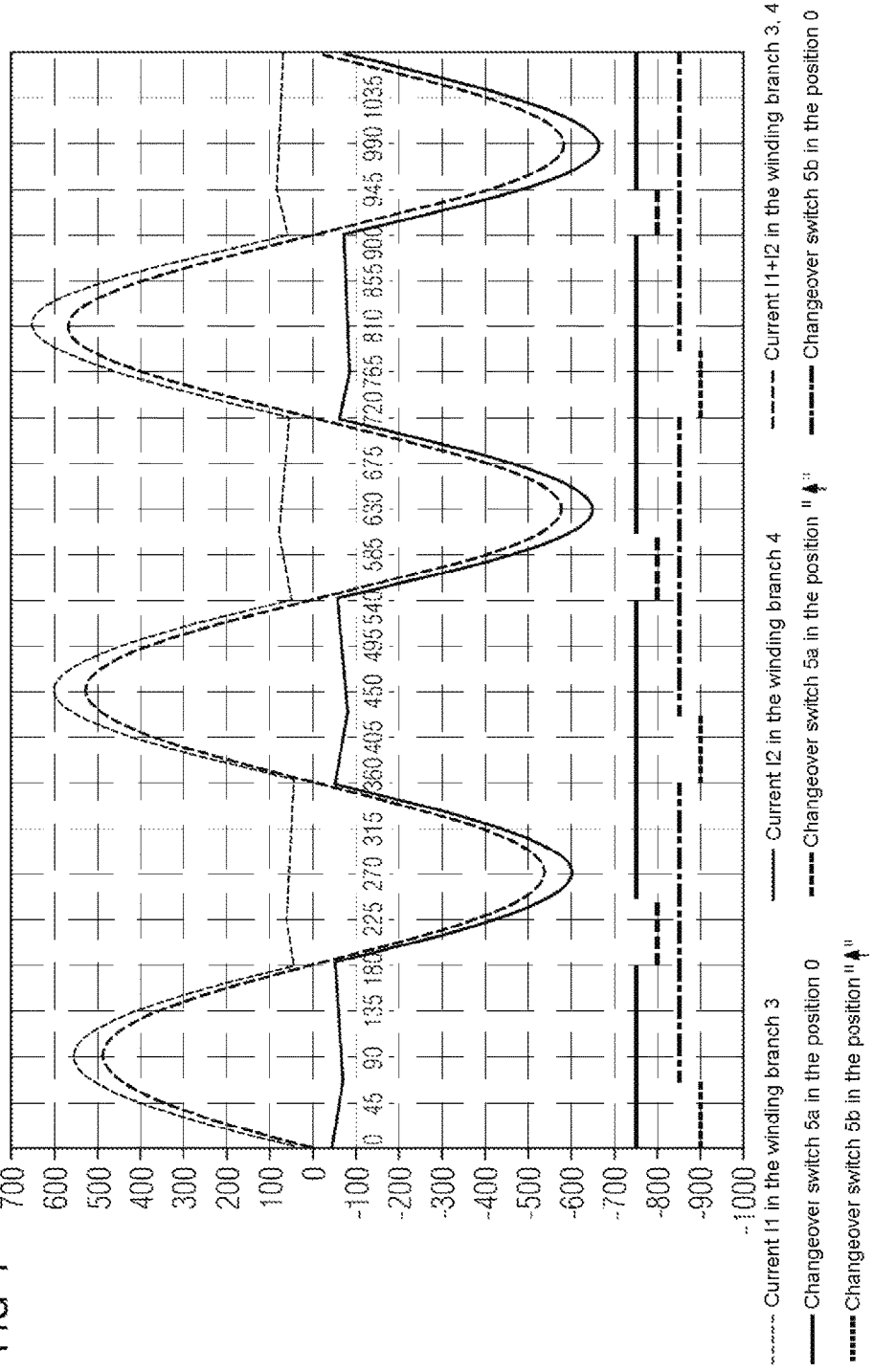

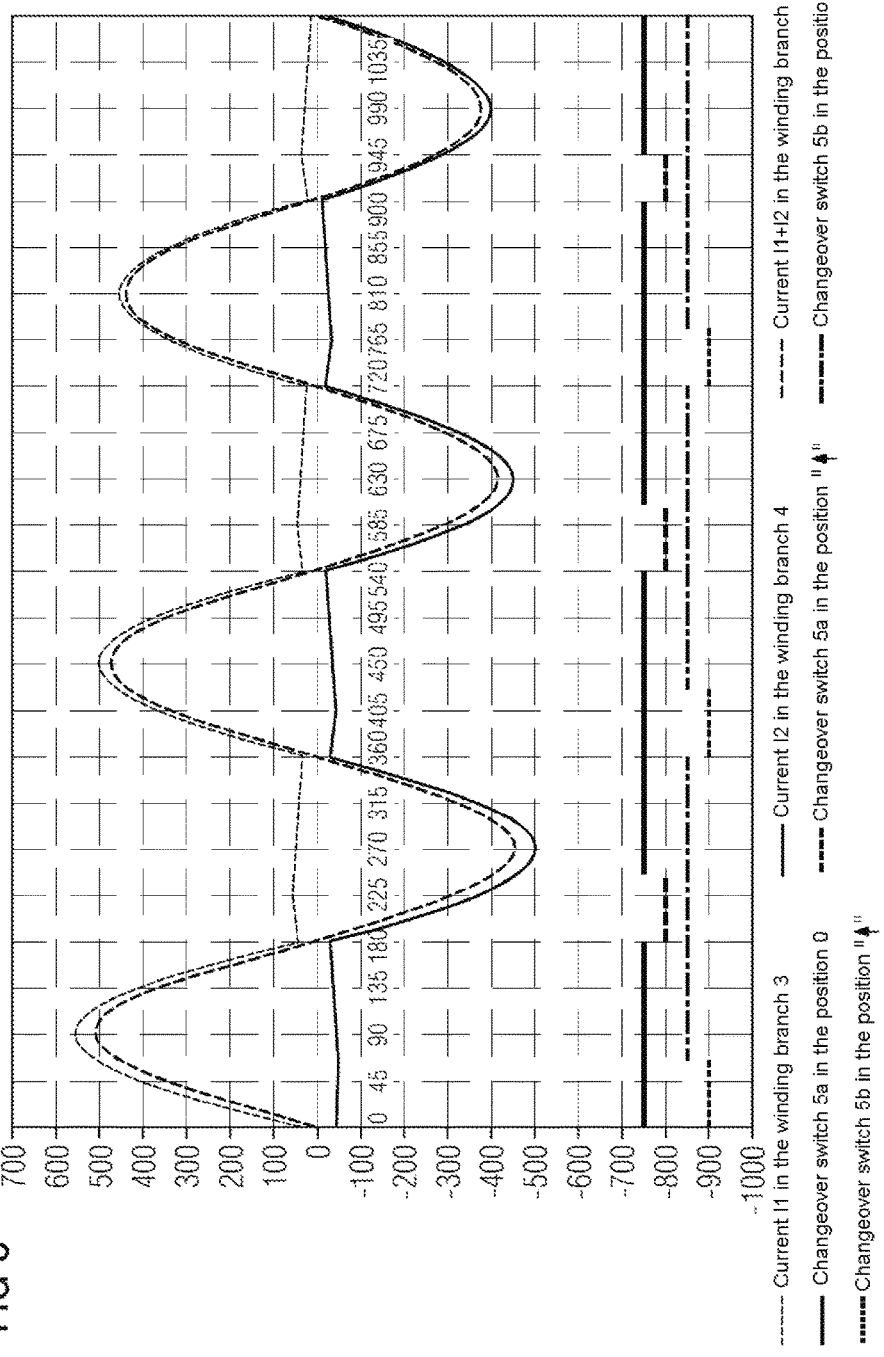

CONTINUOUSLY VARIABLE SATURABLE SHUNT REACTOR

CROSS-REFERENCE TO RELATED APPLICATION

This application claims the priority, under 35 U.S.C. §119, of European Patent Application EP 15 193 880.0, filed Nov. 10, 2015; the prior application is herewith incorporated by reference in its entirety.

BACKGROUND OF THE INVENTION

Field of the Invention

The invention relates to a continuously variable saturable shunt reactor, including a laminated core having two wound limbs for each phase. The limbs are connected by yokes, a network winding branch is disposed on each wound limb, high-voltage ends of the two network winding branches of a phase are connected to a phase conductor and low-voltage ends of the network winding branches are connected to a DC voltage source.

Shunt reactors which are continuously variable by premagnetization (MCSR: Magnetically Controlled Shunt Reactors) of the kind mentioned in the introduction are used for voltage stabilization in the event of load fluctuations in high-voltage networks and transmission lines and also for compensation of excess reactive power in high-voltage networks and industrial installations.

MCSRs have the following advantages over the reactors which can be controlled by tap changers:

a significantly larger control range of the reactive power: 1:100 in the case of an MCSR instead of a maximum of 1:2 in the case of a reactor with tap-changer control (networks with highly fluctuating load require at least 1:10), a significantly shorter time for changing the reactive power from minimum to maximum: 0.3 s in the case of an MCSR instead of 1-3 min in the case of a reactor with tap-changer control (approximately 0.3 s are required to compensate for the network voltage jump after load shedding), an unlimited number of power settings in the case of an MCSR (this number is limited by the service life of the tap changer contacts in the case of a reactor with tap-changer control).

However, the disadvantages of an MCSR in comparison to a reactor with tap-changer control include the distortion of the current curve, higher costs and losses. In comparison to static reactive power compensators (SVC: Static Var Compensator) which are known, for example, from Cigré Paper 12-05, 1978, "Reactor transformer for controllable static compensators," MCSRs have lower costs and losses and a higher degree of reliability. That is caused by the significantly lower power of the electronic switching system (1-2% of the reactive power in the case of an MCSR instead of 100% in the case of an SVC).

The first description of the construction and the manner of operation of a modern MCSR has been proposed in Becker H.: "Die steuerbare Drosselspule. Ein statischer Phasenschieber zur Kompensation von Blindlaststößen [The controllable reactor. A static phase shifter for compensating reactive power shocks]" ETZ-B, 1971, vol. 23, issue 12. According to that document, an MCSR includes a closed laminated iron core as in the case of the transformer, an alternating current winding PW which is connected to the feed network, a direct current control winding GW which is fed by a DC voltage source, and a compensating winding DW which is connected in delta. Each of the windings of a phase is divided into two identical parts which are connected in series and which are wound onto the two different core limbs. The parts of the winding PW are connected to one another in the same direction and generate the magnetic fluxes AC, which are directed in the same direction, in the two limbs. The parts of the windings GW are connected back to back and generate the magnetic fluxes DC, which are directed in opposite directions, in the two limbs. Within one half-period, the magnetic fluxes AC and DC are added to one another in the first limb and subtracted one from the other in the second limb. The process is reversed within the second half-period. Given a sufficiently large premagnetization current in the winding GW, the limb 1 enters saturation within a portion of the first half-period, and the limb 2 enters saturation within the same portion of the second half-period. During the saturation of a limb, the inductance of that part of the winding PW which is wound on it is severely reduced, which results in a current pulse with a positive or negative polarity.

The duration of the saturated state of the limbs and therefore the current amplitude in the winding PW can be controlled by varying the DC voltage on the winding GW. The profile of the operating current of an MCSR is not sinusoidal in principle because no current flows through the winding PW during the unsaturated state of a core limb. During rated operation of the MCSR, the duration of the saturated state of each limb is precisely one half-period. As a result, the current in the winding PW is virtually sinusoidal. Due to the back-to-back connection of the winding GW, the currents of all even harmonics circulate in that winding. Due to the delta connection of the compensating winding DW, the 3rd order, 9th order, etc. current harmonics circulate in the compensating winding. Therefore, the windings GW and DW act as filters of the even harmonics, and also of the harmonics which can be divided by 3. The other harmonics: 5th order, 7th order, 11th order, etc. are not compensated and enter the fed network. Those harmonics can be suppressed, as required, by using external LC filters which are connected to the winding DW.

In connection with the development and production of MCSRs in Russia and Ukraine, the above-described MCSR was improved in the following years by reducing the production costs and losses, as is seen, for example, in USSR Patent Application SU 1762322, Russian Patent RU 2063084, Russian Patent RU 2132581 and Russian Patent RU 2217829. A publication by O. M. Budargin, L. V. Makarevitsch, L. A. Mastrukov: "Eine gesteuerte Sättigungs-Drosselspule 180 Mvar, 500 kV von OAG 'Elektrozavod' [A controlled saturable reactor 180 Mvar, 500 kV OJSHC 'Elektrozavod']", Elektro N 6, 2012 proposed removing the premagnetization winding GW and transferring its function to the network winding PW. According to that publication, the network winding of each phase includes two identical parallel branches which are disposed on the different core limbs. The first branches of all of the phases form the first star, and the second branches form the second star. The two stars are connected by way of the high-voltage ends to the transmission line AC. A controlled direct current source is connected between the star points of the two stars. Each star point is grounded by using a grounding reactor. The rated losses are reduced by approximately 50% and the total weight is reduced by approximately 15% due to the removal of the DC current winding.

In Russian Patent RU 2320061, that device was improved by replacing a common DC voltage source with six (two for each phase) separate AC voltage sources D which are fed by the AC network AC. During a specific portion of the period, the source D is connected to the low-voltage end of the corresponding network winding branch by using power transistors or thyristors. As a result, a required premagnetization current is generated therein. This winding end is grounded during the remaining time of the period. This device allows the grounding reactors to be excluded and the currents in the phases to be individually controlled, thus ensuring their symmetry. The center of the premagnetization pulse is shifted by a quarter-period with respect to the center of the operating current pulse, which reduces the required power of the direct current source in comparison to the above-mentioned device.

The last-mentioned device is considered to be the closest prior art. The main disadvantage of that device is the flow of the operating current of the MCSR through the alternating current source D with a relatively lower power during a portion of the period. As the operating current increases up to the rated value, the duration of the operating current pulse becomes ever larger, at most a half-period, that is to say it exceeds the time offset between the pulse starts of the operating current and of the premagnetization current. The alternating current source D is presented as a power converter transformer with a large distance between the primary and secondary windings, in order to ensure the dielectric strength of that section at the test voltages of the MCSR star point. Therefore, the reactance between the windings of the power converter transformer can be comparable with the rated inductance of the MCSR with the core limb fully saturated. That can lead to a distortion of the current waveform of the MCSR and to dangerous increases in voltage at the electronic switches.

A further disadvantage of the prior art is a non-linear dependence of the premagnetization current on the control parameter, duration of the control pulse at the electronic switches, due to the non-constant voltage of the source D within the effective duration of the control pulse. That leads to a reduction in the amplification factor in the feedback loop in the region of the rated current of the MCSR and a corresponding increase in the control error.

SUMMARY OF THE INVENTION

It is accordingly an object of the invention to provide a continuously variable saturable shunt reactor, which overcomes the hereinafore-mentioned disadvantages of the heretofore-known devices of this general type, which reduces the power of the DC voltage sources, the degree of distortion of the operating current, and the control error, and which also reduces the number of DC voltage sources.

With the foregoing and other objects in view there is provided, in accordance with the invention, a DC voltage source which includes two stabilized, single-pole-grounded power converters with opposite polarities and also two electronic transistor changeover switches, which are controlled by a control system, for each phase, the control system is constructed in such a way that direct current is fed to the two network winding branches of a phase in pulses by using the corresponding electronic transistor changeover switch, and the direct current is fed into the two network winding branches at opposite poles from different power converters.

In this case, the invention is based on the consideration that, analogously to the prior art, each phase of the MCSR initially contains two parallel branches of the network winding, which parallel branches are disposed on different limbs of a laminated core and are connected between a network phase and the premagnetization source.

In contrast to the prior art, the MCSR proposed herein has two single-pole-grounded stabilized power converters with the positive and negative polarities. By using controlled electronic transistor changeover switches, the corresponding power converters are briefly connected to the low-voltage ends of the parallel winding branches. The required premagnetization currents are generated in the two winding branches as a result.

In this case, the power converters are advantageously the same, that is to say they are of identical construction, but are disposed with opposite polarity in the process.

A transistor changeover switch is associated with each parallel branch of the network winding. The transistor changeover switches advantageously each include at least three operating positions. A first operating position connects the low-voltage end of the first network winding branch to the first power converter and the low-voltage end of the second network winding branch to the second power converter, a second operating position connects each low-voltage end of the network winding branches to a grounded star point connection, and a third operating position connects the low-voltage end of the first network winding branch to the second power converter and the low-voltage end of the second network winding branch to the first power converter, wherein control of the operating positions of the two transistor changeover switches takes place with a temporal offset of half a sine period.

In this case, the control system is advantageously constructed to control the operating current of the saturable shunt reactor by controlling the duration of the first and third operating positions. The amplitude of the operating current is advantageously compared with the setpoint value amplitude in the process. The deviation controls the duration of the respective operating positions in a phase in such a way that the deviations in the amplitudes are minimized.

Furthermore, the control system is advantageously constructed to compare the positive and negative amplitudes of the operating current of each phase with one another and in the same way to control the amplitudes in order to minimize the deviation between the amplitudes.

During the saturated state of a wound core limb, the low-voltage end of the network winding branch which is disposed on it is advantageously grounded by using the corresponding electronic transistor changeover switch, that is to say connected to the star point connection, and furthermore, during a time interval, which is prespecified by the control configuration, within the unsaturated state of a wound core limb, the low-voltage end of the network winding branch which is disposed on it is advantageously connected to one of the power converters by using the corresponding electronic transistor changeover switch. The pulse feeding of each winding branch is therefore performed during the passive half-period when the corresponding core limb is not saturated and the operating current is not flowing in the branch.

Furthermore, the control system is advantageously constructed to automatically control the rate of change in the amplitude of the operating current of the saturable shunt reactor by controlling the output voltages of the two power converters.

In a further advantageous refinement, the control system is constructed to compare the amplitudes of the operating current of all of the phases with one another, and to correct the duration of the respective operating position in the phases in such a way that these amplitudes are the same.

Other features which are considered as characteristic for the invention are set forth in the appended claims.

Although the invention is illustrated and described herein as embodied in a continuously variable saturable shunt reactor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3 is a diagram showing a current profile in branches of a network winding of a phase during operation with a constant load of the MCSR;

FIG. 4 is a diagram showing a current profile in branches of the network winding of a phase during operation with a load increase of the MCSR; and FIG. 5 is a diagram showing a current profile in branches of the network winding of a phase during operation with a load shedding of the MCSR.

DETAILED DESCRIPTION OF THE INVENTION

Figure 1:
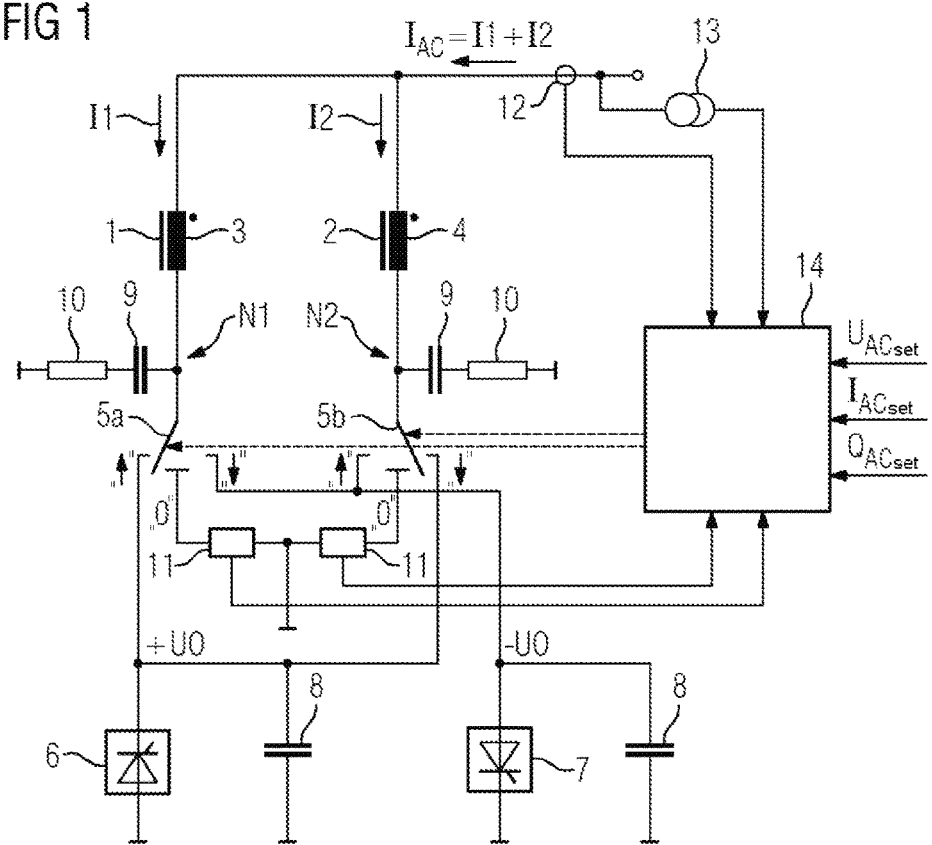
FIG. 1 is a simplified electrical circuit diagram of an MCSR with a mechanical illustration of an electronic transistor changeover switch.

Referring now to the figures of the drawings in detail and first, particularly, to FIG. 1 thereof, there is seen a phase of a saturable shunt reactor (MCSR). Each phase of the MCSR described herein includes two core limbs 1, 2 onto which identical parallel branches 3, 4 of a network winding are wound. High-voltage ends of the branches are jointly connected to a network phase conductor, and low-voltage ends N1 and N2 are individually connected to electronic transistor changeover switches 5a, 5b.

The electronic changeover switches 5a, 5b are controlled independently of one another and can occupy one of three positions: "0", "↑" and "↓". In the position "0", the winding end N1 or N2 is connected to ground. In the position "↑", the winding end N1 is connected to a stabilized thyristor power converter 6 with a positive polarity (voltage +U0), and the winding end N2 is connected to an identical thyristor power converter 7 with a negative polarity (voltage −U0). In the position "↓", the winding end N1 is connected to the negative power converter 7, and the winding end N2 is connected to the positive power converter 6.

Smoothing capacitors 8 with a large capacitance are connected in parallel with the outputs of the power converters 6, 7. The ends N1, N2 of the branches 3, 4 of the network winding are connected to ground by using RC elements (including a capacitor 9 and a resistor 10). These RC elements 9, 10 serve to limit the potentials of the points N1 and N2 during a brief electrical current interruption in the branches 3, 4 of the network winding during transitions of the electronic changeover switches 5a, 5b from one position to another position. In this case, the resistors 10 limit the charge-reversal currents of the capacitors 8, 9 at the start time after changeover of the electronic changeover switches 5a, 5b in order to avoid current overload of the transistors.

The electronic changeover switches 5a, 5b are controlled by a control system 14 which compares the actual signals from a MCSR current sensor 12 and from a network voltage sensor 13 with prespecified setpoint values IACset and UACset. Depending on the value and mathematical sign of the difference deviation signals, the control system 14 generates the control signals for the electronic changeover switches 5a, 5b which determine the duration and the polarity of the pulses of the DC feed.

Hall sensors 11 serve to compare the positive and negative amplitudes of the operating current of the MCSR. If these amplitudes are not the same as a result of non-identical magnetic states of the core limbs 1, 2 of a phase, the control system 14 corrects the magnetization currents in the branches 3, 4 of the network winding in order to achieve more complete suppression of the DC component and the even harmonics in the operating current of the MCSR. In order to suppress the harmonics which can be divided by three, additional compensating windings, which are connected in delta, can be disposed on each core limb 1, 2 (not shown in FIG. 1).

Figure 2:
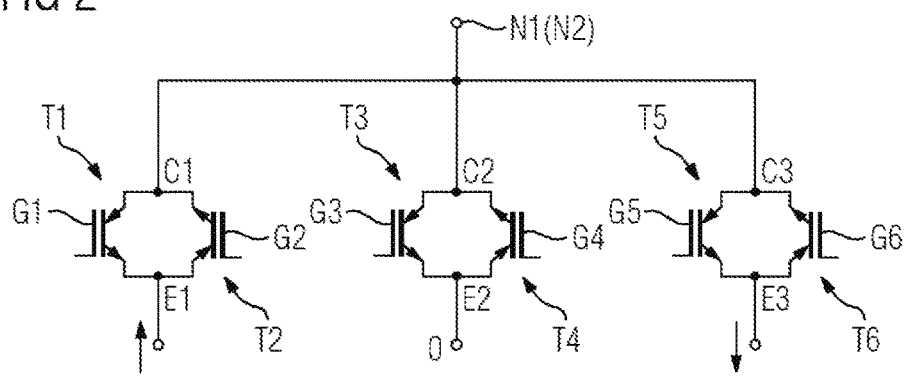
FIG. 2 is a circuit diagram of an example of the electronic transistor changeover switch with IGBT power transistors (electrical illustration of the electronic changeover switch)

FIG. 2 shows a detailed illustration of the electronic changeover switches 5a, 5b. Each electronic changeover switch 5a, 5b includes three identical transistor switches in accordance with the number of operating positions of the changeover switch. Each transistor switch is formed by the parallel connection of two power transistors T1, T2 (or T3, T4; T5, T6), for example IGBT transistors, which are connected back to back. When an unblocking voltage is applied to control electrodes G1, G2 (or G3, G4; G5, G6), the two transistors T1 and T2 are on and conduct the current in both directions.

During a changeover, the transistors T1 and T2 of a previously on switch first switch off and the transistors of a previously off switch are switched on only in a short time of approximately 0.1 ms thereafter. In order to decouple the control system 14 from the power transistors T1 and T2 and therefore from the MCSR star point, the control signals are passed to the electrodes G1, G2 by using a fiber-optic cable.

The manner of operation of the electrical circuit of the MCSR which has been described up until this point will be described in the text which follows. When the network windings 3, 4 are connected to the AC network (AC: Alternating Current), the AC magnetic fluxes, which are directed in the same direction, occur in the core limbs 1, 2. If no magnetization current flows in the winding branches 3, 4 in the process, the core is not saturated and consumes only a low idle current, like a transformer, in the MCSR.

When the direct currents with the opposite polarities occur at the same time in the winding branches 3, 4, the DC magnetic fluxes (DC: Direct Current), which are directed in opposite directions, occur in the core limbs 1, 2 and are added to the AC fluxes. As a result, the active half-periods, when the directions of the AC and DC currents are the same, alternate in each core limb 1, 2 with the passive half-periods, when these currents are directed in opposite directions. During an active half-period, the core limb can be saturated within a specific portion of the half-period. The alternating saturation of the limbs 1, 2 creates positive network-frequency current pulses in the winding branch 3 and negative network-frequency current pulses in the winding branch 4, with the current pulses leading to a bipolar current profile in the phase conductor. The duration and the amplitude of these pulses increases as the premagnetization current increases.

During rated operation, the core limbs 1, 2 are saturated during the entire active half-period. During an active half-period, the changeover switch 5a (5b) occupies the position "0", which prevents the operating current from flowing through the power converters 6, 7 and reducing the power thereof. During a passive half-period, the corresponding core limb 1 or 2 is not saturated and only a relatively small premagnetization current flows through the network winding branch 3 or 4 which is wound onto that core limb. The winding end N1, N2 can first be connected to a power converter 6, 7 within this time interval.

The manner of operation will be explained in greater detail with reference to the graphs in FIG. 3 to FIG. 5. Those figures each show the time profile of the currents I1, I2 through the network winding branches 3 and 4 and the sum of the currents I1+I2=IAC, in each case in amperes. The positions of the changeover switches 5a, 5b prevailing at the respective time are shown in the lower region of FIG. 3 to FIG. 5.

During operation with a constant load of the MCSR (FIG. 3), the premagnetization current has to be constant. Due to a large time constant of the branches 3 and 4 of the network winding in comparison with the AC period, a reduction in this current within the period, which reduction is caused by the losses in the network winding and in the changeover switches 5a, 5b, is low. The premagnetization current is returned to the starting value within a brief time interval of the passive half-period when the electronic changeover switch 5a or 5b is in the position "↑". Within this time interval, the premagnetization current increases linearly at a rate which is proportional to the voltage U0 of the DC sources 6, 7.

The control system 14 determines the duration of this time interval depending on the control deviation in the preceding AC period. When this control deviation lies within an acceptable limit, the electronic changeover switch 5a, 5b remains in the position "0" for the entire period.

During operation with a load increase of the MCSR (FIG. 4), the premagnetization current has to be increased from period to period until it reaches a new value which is required for an increased value of the operating current. This operation differs from operation with a constant current only by way of a longer time interval for which the electronic changeover switches 5a, 5b are in the position "↑". The control system 14 limits the duration of this time interval to the duration of the unsaturated state of the core limbs in order to prevent the operating current flowing through the power converter 6, 7. After the new value of the controlled parameter (amplitude of the MCSR current or the network voltage) is reached, the control system 14 moves the electronic changeover switches 5a, 5b to operation with the constant load. In order to reduce the duration of the transition process, the control system automatically increases the voltages ±U0 of the thyristor power converters 6, 7 in the case of a large control deviation.

During operation with a load shedding of the MCSR (FIG. 5), the premagnetization current has to be reduced from period to period until it reaches a new value which is required for a reduced value of the operating current. During this operation, the control system 14 moves the electronic changeover switches 5a, 5b to the position "↓" during the passive half-periods. The duration of this state of the electronic changeover switches is proportional to the value of the control deviation. As during operation with a load increase, the duration of the state "↓" of the electronic changeover switches is limited to the duration of the unsaturated state of the core limbs. During this operation, the power converters 6, 7 function as inverters. As a result, the DC component of the energy of the MCSR magnetic field returns to the feed network. As during operation with a load increase, the control system 14 automatically increases the voltages ±U0 of the thyristor power converters 6, 7 in the case of a large control deviation.

The following is a summary list of reference numerals and the corresponding structure used in the above description of the invention:

LIST OF REFERENCE SYMBOLS 1, 2 Core limb
3, 4 Network winding branch
5a, 5b Transistor changeover switch
6, 7 Thyristor power converter
8 Smoothing capacitor
9 Capacitor
10 Resistor
11 Hall sensor
12 MCSR current sensor
13 Network voltage sensor
14 Control system
C1, C2, C3 Collector
E1, E2, E3 Emitter
G1, G2, G3,
G4, G5, G6 Control electrode
I1, I2, IAC Current
IACset Setpoint current value
QACset Setpoint reactive power value
N1, N2 Low-voltage end
T1, T2, T3, T4, T5, T6 Power transistor
U0 Voltage
UACset Setpoint voltage value

The invention claimed is:

1. A continuously variable saturable shunt reactor, comprising:
   a laminated core having two wound limbs for each phase, said wound limbs being connected by yokes;
   two network winding branches each being disposed on a respective one of said wound limbs, said network winding branches having high-voltage ends and low-voltage ends;
   a phase conductor connected to said high-voltage ends of said two network winding branches of a phase;
   a DC voltage source connected to said low-voltage ends of said network winding branches, said DC voltage source including two stabilized, single-pole-grounded power converters with opposite polarities and two electronic transistor changeover switches; and
   a control system controlling said electronic transistor changeover switches for each phase, said control system being configured to feed direct current to each of said two network winding branches of a phase in pulses by using a respective one of said electronic transistor changeover switches, and the direct current being fed into each of said two network winding branches at opposite poles from a respective one of said power converters.

2. The continuously variable saturable shunt reactor according to claim 1, wherein said power converters have an identical construction.

3. The continuously variable saturable shunt reactor according to claim 1, wherein:
   said two network winding branches are first and second network winding branches;

said power converters are first and second power converters;

said transistor changeover switches each have at least first, second and third operating positions;

said first operating position connects said low-voltage end of said first network winding branch to said first power converter and connects said low-voltage end of said second network winding branch to said second power converter;

said second operating position connects each of said low-voltage ends of said network winding branches to a grounded star point connection;

said third operating position connects said low-voltage end of said first network winding branch to said second power converter and connects said low-voltage end of said second network winding branch to said first power converter; and a control of said operating positions of said two transistor changeover switches takes place with a temporal offset of half of a sine period.

4. The continuously variable saturable shunt reactor according to claim 3, wherein said control system is configured to control an operating current of the saturable shunt reactor by controlling a duration of said first and third operating positions.

5. The continuously variable saturable shunt reactor according to claim 4, wherein said control system is configured to compare actual and setpoint value amplitudes and positive and negative amplitudes of the operating current of each phase with one another in each case, and to correct a duration of said respective operating positions in a phase to minimize deviations of the amplitudes.

6. The continuously variable saturable shunt reactor according to claim 1, wherein during a saturated state of one of said wound core limbs, said low-voltage end of said network winding branch disposed on said one wound core limb is grounded by using one of said electronic transistor changeover switches.

7. The continuously variable saturable shunt reactor according to claim 1, wherein during a prespecified time interval within an unsaturated state of one of said wound core limbs, said low-voltage end of said network winding branch disposed on said one wound core limb is connected to one of said power converters by using one of said electronic transistor changeover switches.

8. The continuously variable saturable shunt reactor according to claim 1, wherein said control system is configured to automatically control a rate of change in an operating current of the saturable shunt reactor by controlling output voltages of said two power converters.

9. The continuously variable saturable shunt reactor according to claim 1, wherein said control system is configured to compare amplitudes of an operating current of all phases with one another and to correct a duration of said respective operating positions in the phases to make the amplitudes the same.

* * * * *